(12) United States Patent
Couillard et al.

(10) Patent No.: US 7,579,654 B2
(45) Date of Patent: Aug. 25, 2009

(54) SEMICONDUCTOR ON INSULATOR STRUCTURE MADE USING RADIATION ANNEALING

(75) Inventors: James Gregory Couillard, Ithaca, NY (US); Philippe Lehuede, Yerres (FR); Sophie A Vallon, Bretigny sur Orge (FR)

(73) Assignee: Corning Incorporated, Corning, NY (US)

( * ) Notice: Subject to any disclaimer, the term of this patent is extended or adjusted under 35 U.S.C. 154(b) by 82 days.

(21) Appl. No.: 11/726,290

(22) Filed: Mar. 21, 2007

(65) Prior Publication Data
US 2007/0281172 A1 Dec. 6, 2007

Related U.S. Application Data

(60) Provisional application No. 60/809,881, filed on May 31, 2006.

(51) Int. Cl.
*H01L 27/01* (2006.01)
(52) U.S. Cl. .............. 257/347; 257/E27.112; 257/E21.32; 257/E21.331; 438/479; 438/480; 438/517; 438/458
(58) Field of Classification Search .......... 257/347, 257/E27.112
See application file for complete search history.

(56) References Cited

U.S. PATENT DOCUMENTS

| | | | |
|---|---|---|---|
| 4,390,392 A | 6/1983 | Robinson et al. ............. 156/643 |
| 5,395,481 A | 3/1995 | McCarthy ..................... 156/630 |
| 6,486,008 B1 | 11/2002 | Lee ............................... 438/149 |
| 6,528,361 B1 * | 3/2003 | Ahn et al. ..................... 438/166 |
| 6,534,380 B1 | 3/2003 | Yamauchi et al. ............ 438/455 |
| 6,830,993 B1 | 12/2004 | Im et al. ...................... 438/479 |
| 2003/0060026 A1 | 3/2003 | Yamazaki et al. ............ 438/479 |
| 2003/0183876 A1 * | 10/2003 | Takafuji et al. ............. 257/347 |
| 2004/0055999 A1 | 3/2004 | Chen et al. ................... 216/57 |
| 2004/0061176 A1 * | 4/2004 | Takafuji et al. ............. 257/347 |
| 2004/0232488 A1 | 11/2004 | Forbes ......................... 257/347 |
| 2005/0014315 A1 | 1/2005 | Yamamoto et al. .......... 438/166 |
| 2005/0130429 A1 | 6/2005 | Rayssac et al. .............. 438/690 |

FOREIGN PATENT DOCUMENTS

FR 2610450 1/1987

OTHER PUBLICATIONS

"Solidification temperature of silicon surface layer melted by pulsed laser irradiation", *Applied Surface Science*, v 143(1-4), p. 265-71 (1999).

(Continued)

*Primary Examiner*—Tu-Tu V Ho
(74) *Attorney, Agent, or Firm*—Bruce P. Watson; Timothy M. Schaeberk; Matthew B. Dernier

(57) ABSTRACT

Systems and methods for and products of a semiconductor-on-insulator (SOI) structure including subjecting at least one unfinished surface to a laser annealing process. Production of the SOI structure further may include subjecting an implantation surface of a donor semiconductor wafer to an ion implantation process to create an exfoliation layer in the donor semiconductor wafer; bonding the implantation surface of the exfoliation layer to an insulator substrate; separating the exfoliation layer from the donor semiconductor wafer, thereby exposing at least one cleaved surface; and subjecting the at least one cleaved surface to the laser annealing process.

16 Claims, 9 Drawing Sheets

OTHER PUBLICATIONS

"Laser and energy-beam annealing of mechanical damage in silicon caused by slicing and lapping", *Journal of Applied Physics*, v60(11), p. 4007-11 (1986).

"Characterization of excimer laser annealing of ion implanted Si", *IEEE Electron Device Letters*, v EDL-3(10), p. 280-3 (1982).

"Planarization of rough silicon surfaces by laser annealing", *Applied Surface Science* v 109-110, p. 473-6 (1997).

Solar Energy Materials & Solar Cells 62 (2000) 1-19 "Thotovoltaic materials, past present, future" by Adolf Goetzberger and Christopher Hebling.

"The Crystalline Silicon Thin-Film Solar Cell—The High Temperature Approach" C. Hebling, A. Eyer, F.R. Faller, A. Hurrle, R. Ludemann, S. Reber and W. Wettling, pp. 608-622.

* cited by examiner

SEMICONDUCTOR ON INSULATOR STRUCTURE MADE USING RADIATION ANNEALING

CROSS-REFERENCE TO RELATED APPLICATION

The present application claims benefit of the earlier filing date of U.S. Provisional Patent Application No. 60/809,881, filed on May 31, 2006, entitled "SEMICONDUCTOR ON INSULATOR STRUCTURE MADE USING RADIATION ANNEALING," the content of which is relied upon and incorporated herein by reference in its entirety.

FIELD OF THE INVENTION

The present invention relates to the systems, methods and products of manufacture of a semiconductor-on-insulator (SOI) structure using improved processes, including radiation annealing, and in particular, laser annealing for finishing the semiconductor layer.

BACKGROUND OF THE INVENTION

To date, the semiconductor material most commonly used in semiconductor-on-insulator structures has been silicon. Such structures have been referred to in the literature as silicon-on-insulator structures and the abbreviation "SOI" has been applied to such structures. SOI technology is becoming increasingly important for high performance thin film transistors, solar cells, image sensors, and displays, such as active matrix displays. SOI structures may include a thin layer of substantially single-crystal silicon (generally 0.05-0.3 microns (50-300 nm)) in thickness but, in some cases, as thick as 20 microns (20000 nm) on an insulating material.

For ease of presentation, the following discussion will at times be in terms of SOI structures. The references to this particular type of SOI structure are made to facilitate the explanation of the invention and are not intended to, and should not be interpreted as, limiting the invention's scope in any way. The SOI abbreviation is used herein to refer to semiconductor-on-insulator structures in general, including, but not limited to, silicon-on-insulator structures. Similarly, the SiOG abbreviation is used to refer to semiconductor-on-glass structures in general, including, but not limited to, silicon-on-glass structures. The SiOG nomenclature is also intended to include semiconductor-on-glass-ceramic structures, including, but not limited to, silicon-on-glass-ceramic structures. The abbreviation SOI encompasses SiOG structures.

Various ways of obtaining SOI-structure wafers include (1) epitaxial growth of silicon (Si) on lattice-matched substrates; (2) bonding of a single-crystal silicon wafer to another silicon wafer on which an oxide layer of $SiO_2$ has been grown, followed by polishing or etching of the top wafer down to, for example, a 0.05 to 0.3 micron (50-300 nm) layer of single-crystal silicon; and (3) ion-implantation methods, in which either hydrogen or oxygen ions are implanted, either to form a buried oxide layer in the silicon wafer topped by Si, in the case of oxygen ion implantation, or to separate (exfoliate) a thin Si layer from one silicon wafer for bonding to another Si wafer with an oxide layer, as in the case of hydrogen ion implantation.

The former two methods, epitaxial growth and wafer-wafer bonding, have not resulted in satisfactory structures in terms of cost and/or bond strength and durability. The latter method involving ion implantation has received some attention, and, in particular, hydrogen ion implantation has been considered advantageous because the implantation energies required are typically less than 50% of that of oxygen ion implants and the dosage required is two orders of magnitude lower.

U.S. Pat. No. 5,374,564 discloses a process to obtain a single-crystal silicon film on a substrate using a thermal process. A silicon wafer having a planar face is subject to the following steps: (i) implantation by bombardment of a face of the silicon wafer by means of ions creating a layer of gaseous micro-bubbles defining a lower region of the silicon wafer and an upper region constituting a thin silicon film; (ii) contacting the planar face of the silicon wafer with a rigid material layer (such as an insulating oxide material); and (iii) a third stage of heat treating the assembly of the silicon wafer and the insulating material at a temperature above that at which the ion bombardment was carried out. The third stage employs temperatures sufficient to bond the thin silicon film and the insulating material together, to create a pressure effect in the micro-bubbles, and to cause a separation between the thin silicon film and the remaining mass of the silicon wafer. (Due to the high temperature steps, this process is not compatible with lower-cost glass or glass-ceramic substrates.)

U.S. Patent Application Publication No. 2004/0229444 discloses a process that produces an SiOG structure. The steps include: (i) exposing a silicon wafer surface to hydrogen ion implantation to create a bonding surface; (ii) bringing the bonding surface of the wafer into contact with a glass substrate; (iii) applying pressure, temperature and voltage to the wafer and the glass substrate to facilitate bonding therebetween; and (iv) cooling the structure to facilitate separation of the glass substrate and a thin layer of silicon from the silicon wafer.

The resulting SOI structure just after exfoliation might exhibit excessive surface roughness (e.g., about 10 nm or greater), excessive silicon layer thickness (even though the layer is considered "thin"), unwanted hydrogen ions, and implantation damage to the silicon crystal layer (e.g., due to the formation of an amorphized silicon layer). Because one of the primary advantages of the SiOG material lies in the single-crystal nature of the film, this lattice damage must be healed or removed. Second, the hydrogen ions from the implant are not removed fully during the bonding process, and because the hydrogen atoms may be electrically active, they should be eliminated from the film to insure stable device operation. Lastly, the act of cleaving the silicon layer leaves a rough surface, which is known to cause poor transistor operation, so the surface roughness should be reduced to preferably less than 1 nm $R_A$ prior to device fabrication.

These issues may be treated separately. For example, a thick (500 nm) silicon film is transferred initially to the glass. The top 420 nm then may be removed by polishing to restore the surface finish and eliminate the top damaged region of silicon. The remaining silicon film then may be annealed in a furnace for up to 8 hours at 600° C. to diffuse out the residual hydrogen.

Some have suggested using chemical mechanical polishing (CMP) to further process the SOI structure after the thin silicon film has been exfoliated from the silicon material wafer. Disadvantageously, however, the CMP process does not remove material uniformly across the surface of the thin silicon film during polishing. Typical surface non-uniformities (standard deviation/mean removal thickness) are in the 3-5% range for semiconductor films. As more of the silicon film's thickness is removed, the variation in the film thickness correspondingly worsens.

The above shortcoming of the CMP process is especially a problem for some silicon-on-glass applications because, in some cases, as much as about 300-400 nm of material needs to be removed to obtain a desired silicon film thickness. For example, in thin film transistor (TFT) fabrication processes, a silicon film thickness in the 100 nm range or less may be desired. Additionally, a low surface roughness may also be desirable for a TFT structure.

Another problem with the CMP process is that it exhibits particularly poor results when rectangular SOI structures (e.g., those having sharp corners) are polished. Indeed, the aforementioned surface non-uniformities are amplified at the corners of the SOI structure compared with those at the center thereof. Still further, when large SOI structures are contemplated (e.g., for photovoltaic applications), the resulting rectangular SOI structures are too large for typical CMP equipment (which are usually designed for the 300 mm standard wafer size). Cost is also an important consideration for commercial applications of SOI structures. The CMP process, however, is costly both in terms of time and money. The cost problem may be significantly exacerbated if non-conventional CMP machines are required to accommodate large SOI structure sizes.

In addition, a furnace anneal (FA) may be used to remove any residual hydrogen. However, high temperature anneals are not compatible with lower-cost glass or glass-ceramic substrates. Lower temperature anneals (less than 700° C.) require long times to remove residual hydrogen, and are not efficient in repairing crystal damage caused by implantation. Furthermore, both CMP and furnace annealing increase the cost and lower the yield of manufacturing. Thus, it would be desired that hydrogen is at least partially removed before the anneal such that the anneal step can be reduced in duration.

Therefore, it would desirable to achieve results comparable to or better than those of CMP, possibly in combination with furnace annealing, but without either CMP and furnace annealing and their associated drawbacks.

SUMMARY OF THE INVENTION

In accordance with one or more embodiments of the present invention, systems, methods and apparatus of forming a semiconductor-on-insulator structure, include subjecting an at least one unfinished surface of a semiconductor-on-insulator structure to a radiation annealing process. In accordance with one embodiment, the radiation annealing process includes a laser annealing process. In accordance with another embodiment, the radiation annealing process includes a microwave annealing process.

In accordance with one or more embodiments of the present invention, systems, methods and apparatus of forming a semiconductor-on-insulator structure, include: subjecting an implantation surface of a crystalline donor semiconductor wafer to an ion implantation process to create an exfoliation layer in the donor semiconductor wafer; bonding the implantation surface of the exfoliation layer to an insulator substrate; separating the exfoliation layer from the donor semiconductor wafer, thereby exposing at least one cleaved surface; and subjecting the at least one cleaved surface to a radiation annealing process.

The radiation annealing process heats at least part of the silicon layer to near or past its melting point, allowing at least part of the trapped hydrogen to escape, and healing the damage to the crystal lattice as the material cools. Furthermore, any roughness in the original surface is reduced, either from increased atom mobility at high temperature, or due to surface tension if the material is heated to a liquid state. Thus, with respect to the aforementioned drawbacks of CMP combined with furnace annealing (FA), the use of radiation anneal according to the present invention, such as by use of an excimer laser anneal (ELA) or microwave anneal, has the potential of overcoming the drawbacks of CMP and reducing the anneal time required for hydrogen outgassing.

The at least one cleaved surface may include a first cleaved surface of the crystalline donor semiconductor wafer and a second cleaved surface of the exfoliation layer. The laser annealing process may be applied to the second cleaved surface of the exfoliation layer and/or the first cleaved surface of the donor semiconductor wafer.

The laser annealing process may include subjecting the at least one cleaved surface to an excimer laser. By way of example, the excimer laser may include as a gain medium either a true excited dimer, or an exciplex, such as xenon chloride XeCl. Radiation sources and lasers of other gain media may be used instead of excimer lasers to the extent that the radiation source or laser produces sufficient power to create the desired effects. Preferably, the radiation energy density per pulse or per exposure should be large enough to melt part of the semiconductor layer, but should not fully melt the semiconductor layer. According to certain embodiments of the process of the present invention, the treated surface is subjected to a first laser irradiation first, followed by a second laser irradiation that has a higher intensity than the first laser irradiation.

The radiation wavelength should be selected to allow partial melting of the semiconductor layer. However, it is desirable that the bottom part of the crystalline layer is not melted. Therefore, the penetration depth of light into the semiconductor material should not be too large compared to the semiconductor layer thickness. As discussed below in reference to the Exemplary Data, energy densities per pulse above a threshold of approximately 800 $mJ/cm^2$ at a wavelength of about 308 nm (XeCl laser) caused observable improvement in the surface roughness and in the crystalline quality when the crystalline silicon semiconductor layer thickness was approximately 500 nm. Each combination of semiconductor composition and thickness is expected to have its own energy threshold at which the desired effects are achieved. Therefore, using thinner semiconductor layers of silicon should reduce the energy threshold to below 800 $mJ/cm^2$, while holding the other parameters constant.

It is within the competency of persons of ordinary skill in the radiation and laser arts to select radiation sources and lasers having a suitable penetration depth in the semiconductor material and meeting the minimum power threshold, while operating the lasers at power levels low enough to avoid destroying or fully melting the semiconductor layer. Similarly, it is conceivable, although likely not expedient, to use multiple radiation sources or lasers, possibly of different gain media, either in combination or in sequence, to achieve the desired results.

It is noted that the donor semiconductor wafer may be a part of structure that includes a substantially single-crystal donor semiconductor wafer and optionally includes an epitaxial semiconductor layer disposed on the donor semiconductor wafer. The exfoliated layer (e.g., the layer bonded to the insulator substrate and separated from the donor semiconductor structure) may thus be formed substantially from the single-crystal donor semiconductor wafer material. Alternatively, the exfoliated layer may be formed substantially from the epitaxial semiconductor layer (and which may also include some of the single-crystal donor semiconductor wafer material).

The aforementioned laser annealing process may be applied to the exfoliated layer irrespective of whether it is formed substantially from the single-crystal donor semiconductor wafer material or from the epitaxial semiconductor layer.

In one or more embodiments, the step of bonding may include: heating at least one of the insulator substrate and the donor semiconductor wafer; bringing the insulator substrate into direct or indirect contact with the exfoliation layer of the donor semiconductor wafer; and applying a voltage potential across the insulator substrate and the donor semiconductor wafer to induce the bond. The temperature of the insulator substrate and the semiconductor wafer may be elevated to within about 150° C. of the strain point of the insulator substrate. The temperatures of the insulator substrate and the semiconductor wafer may be elevated to different levels. The voltage potential across the insulator substrate and the semiconductor wafer may be between about 100 to 10000 volts. Stress may be induced such that a fracture occurs substantially at the exfoliation layer. The heat and differential coefficients of thermal expansion, of the hydrogen-defect phase versus the surrounding wafer, cause the exfoliation layer to cleave at the hydrogen-defect phase. The result is a thin film of silicon bonded to the insulator.

The advantages of this invention are best understood after reading the detailed technical description, and in relation to existing SiOG processes. Nonetheless, the primary advantages of one or more embodiments of the present invention include: transfer of thinner silicon films; more uniform silicon films with higher crystal quality; faster manufacturing throughput; improved manufacturing yield; reduced contamination; and easy scalability to large substrates.

Alternatively, thick silicon films are transferred to the insulator substrate, and then polished to remove the damaged surface. Control of this process is difficult for very thin films. Because no material is removed in the process as described in this invention, thin silicon films can be transferred directly.

Uniform films are very desirable. Again, because no material is removed in the process, the silicon film thickness uniformity is determined by the ion implant. This has been shown to be quite uniform, with a standard deviation of around 1 nm. In contrast, polishing typically results in a deviation in film thickness of 5% of the amount removed.

Improving manufacturing yield is also important for waste and cost reduction. By replacing two process steps with one, the overall manufacturing yield is expected to improve. This is particularly true if this polishing process has a low step yield, as anticipated. Although excimer laser crystallization of amorphous silicon films is known to have a low yield, the opposite is true in this particular case due to the single-crystal nature of the silicon. The process window is expected to be large because of the crystalline nature of the film, and therefore the yield is expected to be high.

Due to the sensitive nature of semiconductors, contamination may adversely affect performance, so reducing contamination is highly desirable. With this in mind, the laser process is cleaner than polishing with an abrasive slurry. Furthermore diffusion of contaminants is reduced during the rapid laser pulses compared to a lengthy thermal anneal process. This is an important consideration when fabricating electronic devices.

The process is easily scalable to large areas. Excimer laser annealing is currently being applied to substrates up to 730 mm by 920 mm (Gen4) in size by display manufacturers. The substrate size can easily be increased as the substrate is scanned under the laser beam. This scalability potentially extends the product life as customer substrate size requirements increase. In contrast, surface polishing and furnace annealing become increasingly difficult for larger substrate sizes.

Other aspects, features, advantages, etc. will become apparent to one skilled in the art when the description of the invention herein is taken in conjunction with the accompanying drawings.

BRIEF DESCRIPTION OF THE DRAWINGS

For the purposes of illustrating the various aspects of the invention, there are shown in the drawings forms that are presently preferred, it being understood, however, that the invention is not limited by or to the precise arrangements and instrumentalities shown, but rather only by the claims.

DETAILED DESCRIPTION OF THE INVENTION

Unless otherwise indicated, all numbers such as those expressing weight percents of ingredients, dimensions, and values for certain physical properties used in the specification and claims are to be understood as being modified in all instances by the term "about." It should also be understood that the precise numerical values used in the specification and claims form additional embodiments of the invention. Efforts have been made to ensure the accuracy of the numerical values disclosed in the Examples. Any measured numerical value, however, can inherently contain certain errors resulting from the standard deviation found in its respective measuring technique.

By "crystalline semiconductor material," it is meant that the material may be completely crystalline or substantially crystalline, with or without intentionally or accidentally introduced defects and/or dopants therein. It typically contains one or several single crystal domains, i.e., domains of common crystalline orientation, with at least one dimension of the domains larger than 1 mm. Thus it should include: (i) precursor materials, semiconductive or non-semiconductive per se, for forming materials having semiconductive properties, and (ii) materials that are semiconductive per se, formed by, e.g., doping precursor materials. The crystalline semiconductor material may be single crystalline or polycrystalline. Indeed, semiconductive materials normally contain at least some internal or surface defects, including but not limited to dopants, dislocations, damaged regions and holes.

Figure 1:
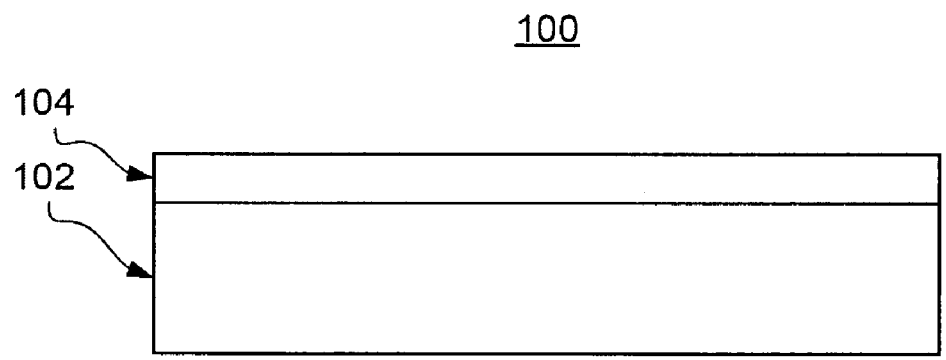
FIG. 1 is a block diagram illustrating the structure of an SOI device in accordance with one or more embodiments of the present invention.

With reference to the drawings, wherein like numerals indicate like elements, there is shown in FIG. 1 an SOI structure 100 in accordance with one or more embodiments of the present invention. With respect to the figures, the SOI structure 100 is exemplified as an SiOG structure. The SiOG structure 100 may include a glass substrate 102, and a semiconductor layer 104. The SiOG structure 100 has suitable uses in connection with fabricating thin film transistors (TFTs), e.g., for display applications, including organic light-emitting diode (OLED) displays and liquid crystal displays (LCDs), integrated circuits, photovoltaic devices, etc.

For the purposes of discussion, it is assumed that the semiconductor layer 104 is formed from silicon. It is understood, however, that the semiconductor material may be a silicon-based semiconductor or any other type of semiconductor, such as the III-V, II-VI, etc., classes of semiconductors. Examples of these materials include: silicon (Si), germanium-silicon (SiGe), silicon carbide (SiC), germanium (Ge), gallium arsenide (GaAs), gallium phosphide (GaP), and indium phosphide (InP).

The glass substrate 102 may be formed from an oxide glass or an oxide glass-ceramic. Although not required, the embodiments described herein may include an oxide glass or glass-ceramic exhibiting a strain point of less than about 1,000° C. As is conventional in the glass making art, the strain point is the temperature at which the glass or glass-ceramic has a viscosity of $10^{14.6}$ poise ($10^{13.6}$ Pa·s). As between oxide glasses and oxide glass-ceramics, the glasses may have the advantage of being simpler to manufacture, thus making them more widely available and less expensive.

By way of example, the glass substrate 102 may be formed from glass substrates containing alkaline-earth ions, such as, substrates made of Glass Code 1737 and EAGLE 2000™, both available from Corning Incorporated, Corning, N.Y., U.S.A. These glass materials have particular use in, for example, the production of liquid crystal displays.

The glass substrate may have a thickness in the range of about 0.1 mm to about 10 mm, such as in the range of about 0.5 mm to about 3 mm. For some SOI structures, insulating layers having a thickness greater than or equal to about 1 micron are desirable, e.g., to avoid parasitic capacitive effects which arise when standard SOI structures having a silicon/silicon dioxide/silicon configuration are operated at high frequencies. In the past, such thicknesses have been difficult to achieve. In accordance with the present invention, an SOI structure having an insulating layer thicker than about 1 micron is readily achieved by simply using a glass substrate 102 having a thickness that is greater than or equal to about 1 micron. A lower limit on the thickness of the glass substrate 102 may be about 1 micron, i.e., 1000 nm. Nonetheless, to obtain a high mechanical strength of the final structure, it is desired that the substrate has a thickness of higher than 10 μm. In certain embodiments, it is desired that the glass substrate have a thickness of higher than 30 μm (for reasons of, e.g., commercial availability).

In general, the glass substrate 102 should be thick enough to support the semiconductor layer 104 through the bonding process steps, as well as subsequent processing performed on the SiOG structure 100. Although there is no theoretical upper limit on the thickness of the glass substrate 102, a thickness beyond that needed for the support function or that desired for the ultimate SiOG structure 100 might not be advantageous since the greater the thickness of the glass substrate 102, the more difficult it will be to accomplish at least some of the process steps in forming the SiOG structure 100.

The oxide glass or oxide glass-ceramic substrate 102 may be silica-based. Thus, the mole percent of $SiO_2$ in the oxide glass or oxide glass-ceramic may be greater than 30 mole percent and may be greater than 40 mole percent. In the case of glass-ceramics, the crystalline phase can be mullite, cordierite, anorthite, spinel, or other crystalline phases known in the art for glass-ceramics. Non-silica-based glasses and glass-ceramics may be used in the practice of one or more embodiments of the invention, but are generally less advantageous because of their higher cost and/or inferior performance characteristics.

Similarly, for some applications, e.g., for SOI structures employing semiconductor materials that are not silicon-based, glass substrates which are not oxide based, e.g., non-oxide glasses, may be desirable, but are generally not advantageous because of their higher cost. As will be discussed in more detail below, in one or more embodiments, the glass or glass-ceramic substrate 102 is designed to match a coefficient of thermal expansion (CTE) of one or more semiconductor materials (e.g., silicon, germanium, etc.) of the layer 104 that are bonded thereto. The CTE match ensures desirable mechanical properties during heating cycles of the subsequent process steps, including, e.g., deposition steps.

For certain applications, e.g., display applications or solar cell applications, the glass or glass-ceramic 102 may be transparent in the visible, near UV, near IR and/or IR wavelength ranges, e.g., the glass or glass ceramic 102 may be transparent in the 350 nm to 2 micron wavelength range.

Although the glass substrate 102 may be composed of a single glass or glass-ceramic layer, laminated structures can be used if desired. When laminated structures are used, the layer of the laminate closest to the semiconductor layer 104 may have the properties discussed herein for a glass substrate 102 composed of a single glass or glass-ceramic. Layers farther from the semiconductor layer 104 may also have those properties, but may have relaxed properties because they do not directly interact with the semiconductor layer 104. In the latter case, the glass substrate 102 is considered to have ended when the properties specified for a glass substrate 102 are no longer satisfied.

Figure 3:
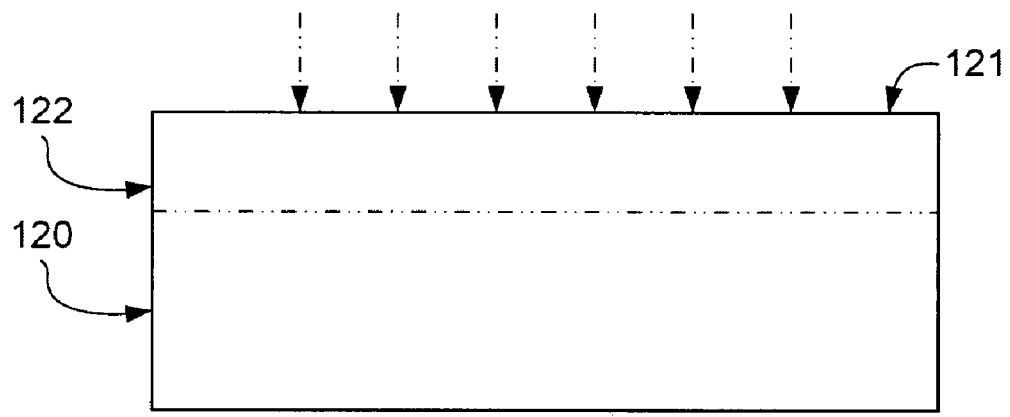
FIGS. 3-6 are block diagrams illustrating intermediate and final structures formed using the process of FIG. 2.
Figure 2:
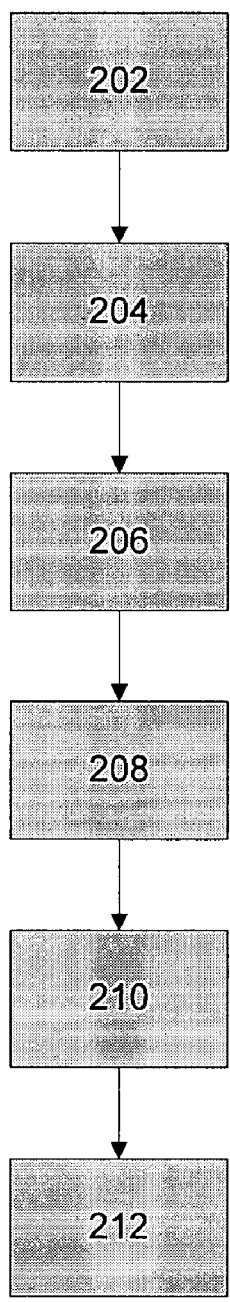
FIG. 2 is a flow diagram illustrating process steps that may be carried out to produce the SOI structure of FIG. 1.

Reference is now made to FIGS. 2-6. FIG. 2 illustrates process steps that may be carried out in order to produce the SiOG structure 100 of FIG. 1 (and/or other embodiments disclosed herein), while FIGS. 3-6 illustrate intermediate structures that may be formed in carrying out the process of FIG. 2. In FIG. 3, the arrows indicate the stream of ions (such as hydrogen ions) and general direction thereof when being implanted. In FIG. 2, the reference numerals have the following meaning:

202: Prepare surface of donor semiconductor wafer;
204: Subject donor semiconductor wafer to an implantation process;
206: Subject the exfoliation layer to mild oxidation;
208: Form anodic bond between exfoliation layer and glass;
210: Separate the glass layer/exfoliation layer from the donor semiconductor wafer; and
212: Subject the donor semiconductor wafer or exfoliation layer to laser annealing process.

Turning first to FIGS. 2 and 3, at action 202, an implantation surface 121 of a donor semiconductor wafer 120 is prepared, such as by polishing, cleaning, etc. to produce a relatively flat and uniform implantation surface 121 suitable for bonding to the glass or glass-ceramic substrate 102. The implantation surface 121 will form the underside of the semiconductor layer 104. For the purposes of discussion, the semiconductor wafer 120 may be a substantially single-crystal Si wafer, although as discussed above any other suitable semiconductor material may be employed.

At action 204, an exfoliation layer 122 is created by subjecting the implantation surface 121 to one or more ion implantation processes to create a weakened region below the implantation surface 121 of the donor semiconductor wafer 120. Although the embodiments of the present invention are not limited to any particular method of forming the exfoliation layer 122, one suitable method dictates that the implantation surface 121 of the donor semiconductor wafer 120 may be subject to a hydrogen ion implantation process to at least initiate the creation of the exfoliation layer 122 in the donor semiconductor wafer 120.

The implantation energy may be adjusted using conventional techniques to achieve an approximate thickness of the exfoliation layer 122. By way of example, hydrogen ion implantation may be employed, although other ions or multiples thereof may be employed, such as boron+hydrogen, helium+hydrogen, or other ions known in the literature for exfoliation. Again, any other known or hereinafter developed technique suitable for forming the exfoliation layer 122 may be employed without departing from the spirit and scope of the present invention. For example, single-beam ion implantation, plasma immersion ion implantation (PIII) and ion shower, involving the use of a single ion species or multiple ion species, may be used.

In the experiments discussed below in the Exemplary Data section, the exfoliation layer 122 had a thickness of about 500 nm, but because the laser annealing redistributes mass, as opposed to removing it, the exfoliation layer 122 may be made as thin as desired and/or as feasible. Moreover, if beginning with an SOI having a semiconductor layer needing laser annealing(thicker than desired, e.g.), a known method of mass removal, such as CMP or polishing, may be used to reduce the thickness of the layer, before the laser annealing finishes the surface. However, using a mass removal step adds time and expense, which laser annealing would otherwise avoid, to the overall manufacturing process.

At action 206 the donor semiconductor wafer 120 may be treated to reduce, for example, the hydrogen ion concentration on the implantation surface 121. For example, the donor semiconductor wafer 120 may be washed and cleaned, and the implantation donor surface 121 of the exfoliation layer 122 may be subject to mild oxidation. The mild oxidation treatments may include treatment in oxygen plasma, ozone treatments, treatment with hydrogen peroxide, hydrogen peroxide and ammonia, hydrogen peroxide and an acid or a combination of these processes. It is expected that during these treatments hydrogen-terminated surface groups oxidize to hydroxyl groups, which in turn also makes the surface of the silicon wafer hydrophilic. The treatment may be carried out at room temperature for the oxygen plasma and at temperature between 25-150° C. for the ammonia or acid treatments.

Figure 4:
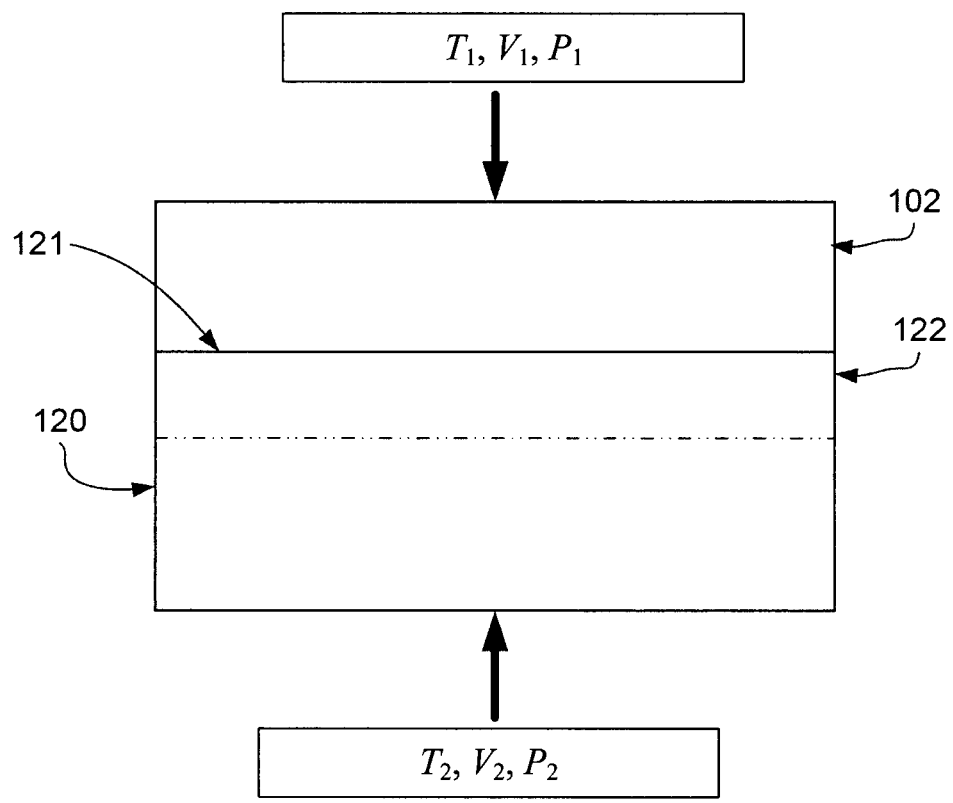

With reference to FIGS. 2 and 4, at action 208 the glass substrate 102 may be bonded to the exfoliation layer 122. A suitable bonding process is described in U.S. Patent Application Publication No. 2004/0229444, the entire disclosure of which is hereby incorporated by reference. Portions of this process, known as anodic bonding, are discussed below. In the anodic bonding process, appropriate surface cleaning of the glass substrate 102 (and the exfoliation layer 122 if not done already) may be carried out. Thereafter, the intermediate structures are brought into direct or indirect contact to achieve the arrangement schematically illustrated in FIG. 4.

Prior to or after the contact, the structure(s) comprising the donor semiconductor wafer 120, the exfoliation layer 122, and the glass substrate 102 are heated under a differential temperature gradient. The glass substrate 102 may be heated to a higher temperature than the donor semiconductor wafer 120 and exfoliation layer 122. By way of example, the temperature difference between the glass substrate 102 and the donor semiconductor wafer 120 (and the exfoliation later 122) is at least 1° C., although the difference may be as high as about 100 to about 150° C. This temperature differential is desirable for a glass having a coefficient of thermal expansion (CTE) matched to that of the donor semiconductor wafer 120 (such as matched to the CTE of silicon) since it facilitates later separation of the exfoliation layer 122 from the semiconductor wafer 120 due to thermal stresses. The glass substrate 102 and the donor semiconductor wafer 120 may be taken to a temperature within about 150° C. of the strain point of the glass substrate 102.

Once the temperature differential between the glass substrate 102 and the donor semiconductor wafer 120 is stabilized, mechanical pressure is applied to the intermediate assembly. The pressure range may be between about 1 to about 50 psi. Application of higher pressures, e.g., pressures above 100 psi, might cause breakage of the glass substrate 102.

Next, a voltage is applied across the intermediate assembly, for example with the donor semiconductor wafer 120 at the positive electrode and the glass substrate 102 the negative electrode. The application of the voltage potential causes alkali or alkaline earth ions in the glass substrate 102 to move away from the semiconductor/glass interface further into the glass substrate 102. This accomplishes two functions: (i) an alkali or alkaline earth ion free interface is created; and (ii) the glass substrate 102 becomes very reactive and bonds strongly to the exfoliation layer 122 of the donor semiconductor wafer 120.

Figure 5:
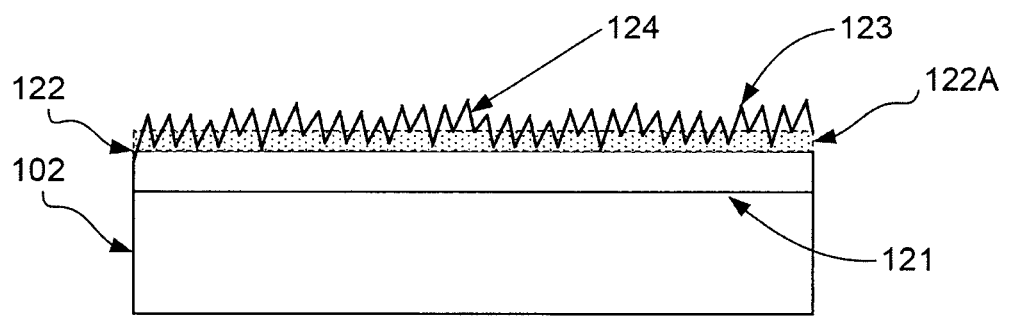

With reference to FIGS. 2 and 5, at action 210 after the intermediate assembly is held under the above conditions for some time (e.g., approximately 1 hour or less), the voltage is removed and the intermediate assembly is allowed to cool to room temperature. The donor semiconductor wafer 120 and the glass substrate 102 are then separated, which may include some peeling if they have not already become completely free, to obtain a glass substrate 102 with the relatively thin exfoliation layer 122 formed of the semiconductor material of the donor semiconductor layer 120 bonded thereto. The separation may be accomplished via fracture of the exfoliation layer 122 due to thermal stresses. Alternatively or in addition, mechanical stresses such as water jet cutting or chemical etching may be used to facilitate the separation.

As illustrated in FIG. 5, after separation, the resulting structure may include the glass substrate 102 and the exfoliation layer 122 of semiconductor material bonded thereto. The cleaved surface 123 of the SOI structure just after exfoliation may exhibit excessive surface roughness (depicted abstractly in FIG. 5), possible excessive silicon layer thickness, and implantation damage 122A of the silicon layer (e.g., due to hydrogen ions and the formation of an amorphized silicon layer). However, as confirmed in FIG. 13, the exfoliation layer 122 may be made much thinner from the start when using laser annealing, because the damaged material of 122A need not be removed, instead damage will be repaired by the laser annealing process.

It is assumed for the purposes of discussion that the final thickness of the semiconductor layer 104 should be lower than 1 micron (i.e., 1000 nm), for example, less than about 200 nm, such as 80 nm or lower. Therefore, an appropriately thin exfoliation layer 122 should be created having an approximate desired thickness. Historically, the amorphized silicon layer has been on the order of about 50-150 nm in thickness, and depending on the implantation energy and implantation time, the thickness of the exfoliation layer 122 has been on the order of about 300-500 nm. With laser annealing, however, a thinner exfoliation layer 122 may be created, with the amorphized silicon layer necessarily being thinner as well.

Figure 6:
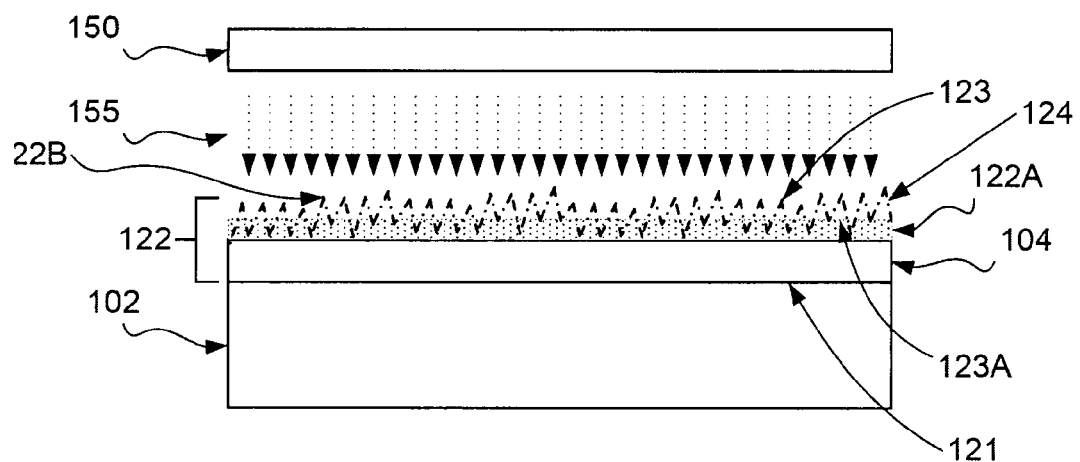

Accordingly, with reference to FIG. 2, action 212 and FIG. 6, the cleaved surface 123 is subject to post processing, which may include subjecting the cleaved surface 123 to a laser annealing process. Experiments with bulk silicon have shown that laser irradiation can heat the silicon surface above its melting temperature (1685 K) for a few tens of nanoseconds. In the case of SiOG, if the peak temperature exceeds 1685 K, and if there remains an unmelted crystalline seed in the film, the film will be crystalline upon cooling, and is expected to be a near-perfect crystal. After irradiation, previously damaged silicon surfaces exhibit fewer defects than in bulk silicon wafers. Additional laser annealing can also smooth polycrystalline films and bulk silicon surfaces.

Figure 7:
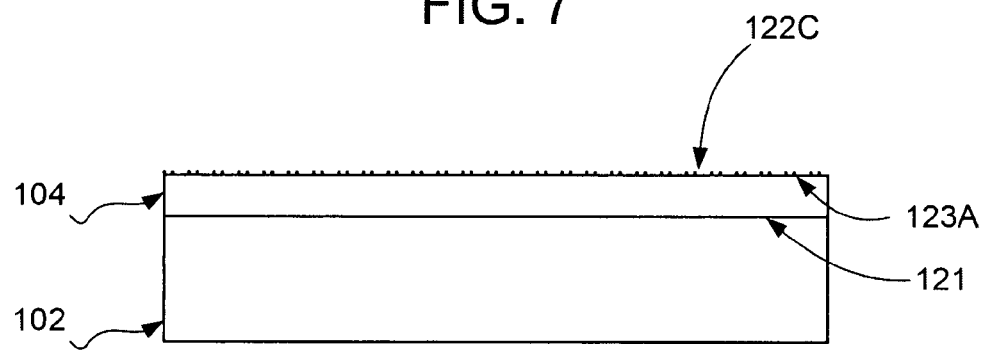
FIG. 7 is a block diagram illustrating an SOI structure after laser annealing.

With reference to FIG. 6, the laser annealing process may be carried out using an excimer laser 150 that irradiates the cleaved surface 123 with radiation 155. As depicted symbolically in FIG. 6, many large irregularities 122B are visible on the cleaved surface 123. The laser annealing process (and thus the redistribution of material 124 and smoothing of surface roughness) is controlled via one or more of the laser composition, laser wavelength, radiation power, exposure time, and number of exposure pulses. When the desired amount of material 124 has been redistributed, creating annealed surface 123A, the laser annealing process may be terminated. In contrast to irregularities 122B of FIG. 6, fewer, relatively minor irregularities 122C are visible on the annealed surface 123A, depicted symbolically in FIG. 7.

Although this description refers to the radiation source as a laser, because that would be a preferred embodiment, the radiation source does not need to be a laser per se. Instead, a radiation source having laser-like effects would suffice. For the present purposes, a radiation source may have laser-like effects to the extent that it meets three requirements: 1) if it is capable of suitable (high) energy density; 2) if it can control the radiation penetration depth into the semiconductor material; and 3) if it can control the irradiation duration (e.g., by using a pulsed source). In particular contrast to a laser, the radiation source does not need to be coherent. Depending on the design and materials parameters, an acceptable radiation source may be, for instance, a microwave emitter, emitting microwave radiation.

Any laser, or radiation source in general, may be used in the present invention to the extent that the radiation source can be configured to anneal the semiconductor layer 104, which is largely dependent on the parameters of the SOI structure 100, such as materials, thicknesses, etc. In this regard, the configuration variations are numerous, not only with respect to the choice of radiation source, but also with respect to irradiation methods, such as pulsed transmission versus continuous wave (CW) transmission, and scanned exposure versus flood exposure.

With respect to lasers in general, the word "laser" is a derivative of the acronym LASER, from Light Amplification by the Stimulated Emission of Radiation. A backformation of LASER, the verb "to lase" has been created to mean "to produce coherent light through stimulated emission." A laser system generally consists of three important parts: an energy source (usually referred to as the pump or pump source); a gain medium; and a mirror, or system of mirrors, forming an optical resonator.

Many different types of lasers exist. Lasers are commonly designated by the employed type of gain medium, also known as the laser, or lasing, material. The gain medium can be, for example, a gas, a vapor, a liquid, a solid, or a semiconductor.

Gas lasers, of which argon and helium-neon, He—Ne, are the most common, emit radiation primarily in the range of visible red light. Another example is the $CO_2$ laser, which emits energy in the far-infrared and is used for cutting hard materials.

Vapor lasers have vaporized metal as the gain medium. Excitation is achieved typically through electrical discharge, such as with copper vapor or gold vapor lasers. The vaporized metal may be mixed with other materials, such as helium gas acting as a buffer in the cases of helium-cadmium (He—Cd), helium-selenium (He—Se) and helium-mercury (He—Hg) lasers.

Liquid lasers include dye lasers, in which the gain medium is a complex organic dye, such as rhodamine 6 G, in liquid solution or suspension. By varying the dye solutions and/or its properties, dye lasers may be tuned over a broad range of wavelengths.

Solid gain medium lasers are also called solid-state lasers and have lasing material distributed in a solid matrix. Examples include the ruby or neodymium:yttrium-aluminum garnet ("Nd—YAG") lasers that emit infrared light at 1,064 nanometers. Multiple frequencies of solid-state lasers can be used, such as frequency-doubled Nd—YAG (532 nm), frequency-tripled Nd—YAG (355 nm) and frequency-quadrupled Nd—YAG (266 nm).

Semiconductor lasers use diodes as the gain medium, causing them to sometimes be called diode lasers. Semiconductor lasers generally use low power and may be very small, facilitating their use in various electronic products such as laser printers and CD players.

Chemical lasers use chemical reactions to achieve excitation at high powers for continuous operation. Two examples include a hydrogen fluoride laser, emitting 2700-2900 nm light, and a deuterium fluoride laser, emitting 3800 nm light, which use the reaction of hydrogen or deuterium gas, respectively, with combustion products of ethylene in nitrogen trifluoride.

A subtype of gas lasers, excimer lasers use reactive gases, which, when electrically stimulated, produce a pseudo molecule called an excited dimer, also known as an excimer. The excimer produces light in the ultraviolet range when lased. In chemistry, a dimer refers to a molecule composed of two similar subunits or monomers linked together. A true excimer is a molecule that forms a dimer from the same molecule in the excited state, whereas an exciplex is a molecule that forms a dimer from different molecules in the excited state. Insofar as exciplexes very commonly are miscalled excimers, reference to excimers includes exciplexes, for purposes of this description. Gases such as chlorine and fluorine may be used to form excimers, when used alone, or exciplexes when mixed with inert gases such as argon, krypton or xenon.

Example of the laser radiation that have been used by the present inventors, in various embodiments of the present application, include: XeCl laser (308 nm); KrF laser (248 nm); and CW argon gas laser. A laser exposure system is described in, e.g., H. J. Kahlert, F. Simon, and B. Burghardt, Mat. Res. Soc. Symp. Proc. Vol. 685E, paper D6.2 (2001), the relevant portion is incorporated herein by reference. This laser system can be adapted for use in the present invention in view of the disclosure of the present application.

Microwave exposure can be done using low and high frequency microwaves. High frequency exposure (e.g. 110 GHz gyrotron source) is preferred for its good electromagnetic coupling to silicon films, but poor coupling to glass. Therefore heating rates in excess of 100° C./second can be achieved with minimal heat transfer to the substrate. In practice, an energy from a gyrotron source would be coupled through a waveguide to a specially designed evacuated sample chamber. The chamber would have at least one variable dimension for tuning of the microwave resonant mode. The film temperature is dictated by the mode pattern, thus for more uniform heating the sample would be desired to be moved relative to the resonant mode pattern (e.g. by rotation).

Various methods can be used to expose the surface by, e.g., the laser beam. Takings laser beam exposure as an example, the following non-limitative approaches are contemplated:
- a single laser beam is used to expose the surface to be treated;
- multiple laser beams are used, simultaneously, successively, or in other manner, to expose the surface to be treated;
- a large area beam may be used to expose the surface treated by, e.g., flood exposure;
- step-and-repeat process typical of lithography process may be adopted in the exposure;
- a linear, narrow beam may be used to scan the surface to be treated;
- a small-area beam may be used to scan the surface via, e.g., vector scanning, raster scanning, and the like;
- a pulsed laser beam is used and the exposure amount is controlled by controlling the total number of pulses thereof;
- a continuous laser beam is used and the exposure time is controlled to control the total irradiation energy; and
- Exposure time is controlled via controlling the speed of the laser beam relative to the surface to be exposed, by, e.g., controlling the translation speed of the stage on which the substrate is placed.

Irrespective of the exposure approach and the laser source, it is desirable in one or more embodiments that the treated surface is subjected to substantially even irradiation energy such that the surface is annealed to substantially the same degree. To that end, a homogeneous laser beam may be desired.

An optical system may be used to create a homogeneous beam over the semiconductor layer surface. The optical system may include homogenizers. Optical systems that can create a homogeneous laser beam are commercially available. The requirements for the homogeneity of the laser beam are dictated by the process window, which in turn depends on the semiconductor layer thickness and on the thickness of the damaged layer. Alternatively, an optical system may be used to create a beam of controlled energy density distribution over the semiconductor layer surface. This is particularly useful in case a scanning method is used and it is desirable to have a variable energy density (e.g., a low energy density for the first pulses and a higher energy density for the next pulses).

Alternative embodiments of the invention will now be described with reference to the aforementioned SiOG processes and further details. For example, a result of separating the exfoliation layer 122 from the donor semiconductor wafer 120 may produce a first cleaved surface of the donor semiconductor wafer 120 and a second cleaved surface 123 of the exfoliation layer 122. As previously discussed, the process of laser annealing may be applied to the second cleaved surface 123 of the exfoliation layer 122. Additionally or alternatively, the process of laser annealing may be applied to the first cleaved surface of the donor semiconductor wafer 120 (using one or more of the techniques described above).

In another embodiment of the present invention, the donor semiconductor wafer may be part of a donor structure, including a substantially single-crystal donor semiconductor wafer 120, and an epitaxial semiconductor layer disposed on the donor semiconductor wafer. (Details of an epitaxially grown semiconductor layer in an SOI context may be found in co-pending U.S. patent application Ser. No. 11/159,889, filed Jun. 23, 2005, the entire disclosure of which is incorporated herein by reference.) The exfoliation layer 122, therefore, may be formed substantially from the epitaxial semiconductor layer (and may also include some of the single-crystal donor semiconductor material from the wafer 120). Thus, the aforementioned laser annealing process may be applied to the cleaved surface of an exfoliation layer formed substantially of epitaxial semiconductor material and/or a combination of epitaxial semiconductor material and single-crystal semiconductor material.

Figure 8:
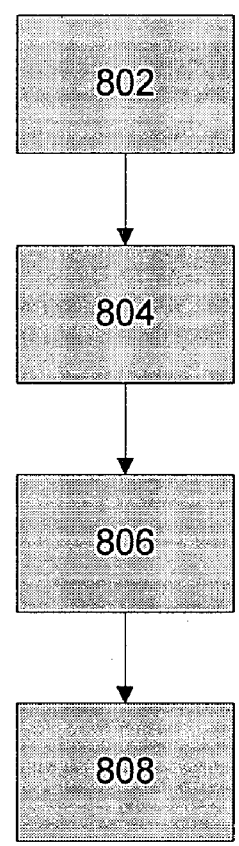
FIG. 8 depicts a flow diagram illustrating process steps for formation of semiconductor-on-insulator structures.

Moreover, the laser annealing process could be automated in a system for the formation of semiconductor-on-insulator structures 100. FIG. 8 shows exemplary formation steps 802-808. In this figure, the reference numerals have the following meaning:
- 802: Prepare non-annealed semiconductor-on-insulator structure;
- 804: Transport and position the SOI structure to and in the laser annealing assembly;
- 806: Perform the laser anneal; and
- 808: Transport the SOI structure from the laser annealing assembly.

The system could include a semiconductor-on-insulator handling assembly, which handles the structures 100 for processing, and a laser annealing assembly. The laser annealing assembly would include a laser for irradiation of semiconductor-on-insulator structures 100 being handled by the semiconductor-on-insulator handling assembly. The handling assembly could furthermore include cleaning of the structures 100 to remove surface contaminants and/or native oxide layer, if any and if desired, prior to irradiation. The laser annealing assembly may operate in a vacuum or controlled atmosphere to also control contamination.

For example, after the SOI structure 100 was partially prepared (step 802), the handling assembly could transport and position (step 804) the SOI structures 100 having unfinished surfaces in need of laser annealing, e.g., cleaved surfaces 123, to and in the laser annealing assembly. Not only may cleaved surfaces 123, formed of exfoliation, benefit from laser annealing, but also the surfaces of semiconductor layers 104 (having damage to their crystalline structure, undesired ion impurities, and/or surface roughness) formed of any number of SOI formation procedures may be characterized as unfinished surfaces 823 in need of laser annealing.

The laser annealing assembly would perform the laser anneal (step 806), and the handling assembly could transport (step 808) the SOI structures 100 having laser annealed surfaces, e.g., annealed surfaces 123A, from the laser annealing assembly for further handling. The laser annealing assembly could be programmable to adjust for varying semiconductor layer materials, thicknesses, manufacturing histories, etc., such as by adjusting the intensity and pulse count of the laser annealing process.

During the radiation anneal process according to the present invention, at least part of the crystalline layer subject to anneal are heated to an elevated temperature, which would allow at least part of the hydrogen or other ion-implanted species to escape. This could lead to a shorter thermal anneal process if such down-stream thermal anneal process is needed. Indeed, as have been found by the present inventors, the radiation anneal process of the present invention can be so efficient in healing the surface defects that the overall duration of this step does not allow the outgassing of all trapped ion-implanted species. In these embodiments, it is desirable that subsequent to the radiation anneal, an additional thermal anneal step is carried out, wherein the entrapped ion-implanted species are allowed to outgassed to a desired degree. Even in these embodiments, due to the partial outgassing during the radiation anneal step, the overall thermal anneal time required can be reduced compared to a CMP surface enhancement process.

It is further contemplated by the present inventors that, prior to the radiation anneal process of the present invention, and during the irradiation anneal process, the crystalline semiconductor layer subject to radiation anneal is heated to an elevated temperature. In certain embodiments, such temperature can range between 100° C. to $T_{sp}-100°$ C., where $T_{sp}$ is the strain point of the glass substrate, if a glass substrate is used, or the melting point of the crystalline substrate, if a crystalline material is used for the substrate. This typically would entail heating the entire SOI structure, or at least a great majority thereof, to this temperature range. Such pre-heating of the crystalline layer has the following advantages, inter alia: (i) it reduces the temperature gradient present in the crystalline semiconductor layer during the radiation anneal step, reducing the possibility of cracking; (ii) it enables the outgassing of more ion-implanted species during the radiation anneal step; (iii) it reduces the duration of a subsequently conducted thermal anneal, if needed; and (iv) it makes it possible to carry out radiation anneal and thermal anneal substantially simultaneously.

The present invention is further illustrated by the following non-limiting examples.

EXAMPLES

A series of experiments was conducted to demonstrate the applicability of the aforementioned laser annealing process on an SiOG structure. An SiOG structure 100 with a 500 nm thick silicon exfoliation layer 122 was exposed to radiation 155 of excimer laser 150 at 400-1250 mJ/cm² for 1 to 100 pulses. The excimer laser 150 used was a XeCl Excimer Laser from Lambda Physik, operating at up to 100 Hz with 28 nsec pulses of 308 nm light. The penetration depth of 308 nm wavelength UV light into silicon is only a few nanometers, which results only in the melting of the top part of the silicon layer, if energy density of the laser beam on the silicon surface is properly chosen. The laser was used with an optical system, including homogenizers, to produce a uniform 5 mm×0.8 mm beam. Step-and-repeat exposure was used in the examples in the present application to expose areas larger than the beam size. Similar laser energies are sufficient to crystallize an amorphous silicon film, resulting in polycrystalline silicon. In the present case, however, the exfoliation layer 122 was a single-crystal film having only implantation damage 122A, allowing the single-crystal film to act as a seed crystal. In the present experiments, energies above a threshold of approximately 800 mJ/cm² caused observable improvement in the surface roughness.

Table 1 below describes the respective improvements to surface roughness ($R_A$ in nanometers) for varying intensities and pulses counts. The initial surface roughness was measured to be 6.6 nm $R_A$ (9.4 nm RMS), while surface roughness of the laser annealed surface 123A was measured to be below 1.0 nm after one laser pulse at 1250 mJ/cm². Likewise, after ten pulses at 1000 mJ/cm², the surface roughness of the laser annealed surface 123A also was reduced to below 1.0 nm.

TABLE 1

|  | 1250 mJ/cm² | 1000 mJ/cm² | 800 mJ/cm² |
| --- | --- | --- | --- |
| 0 pulses | 6.61 | 6.61 | 6.61 |
| 1 pulse | 0.99 | 1.42 | — |
| 2 pulses | 0.98 | 1.16 | 1.45 |
| 10 pulses | 0.63 | 0.74 | 1.29 |

Figure 9:
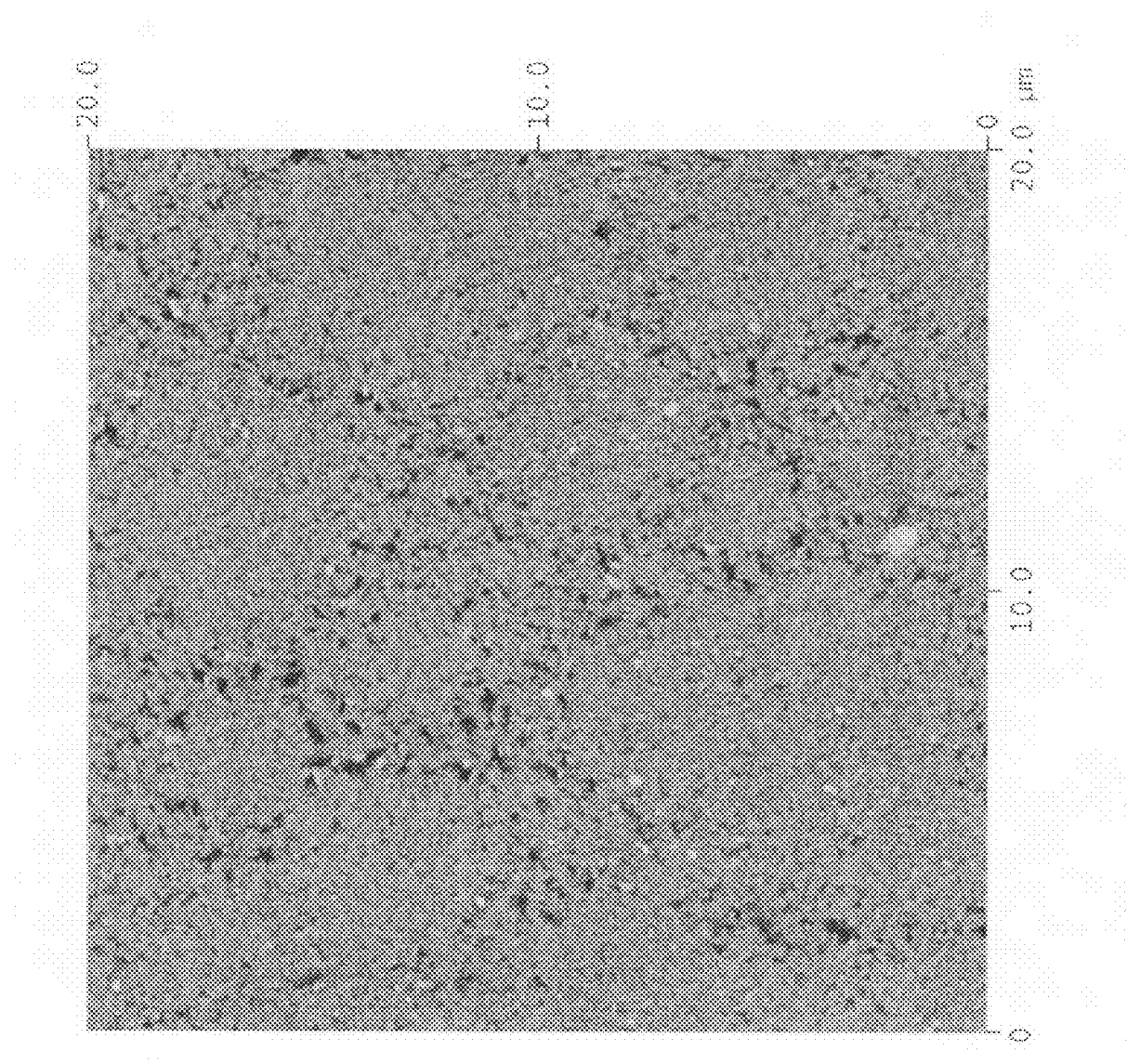
FIG. 9 is atomic force microscopy image of an unfinished exemplarysemiconductor layer, shown prior to laser annealing.
Figure 10:
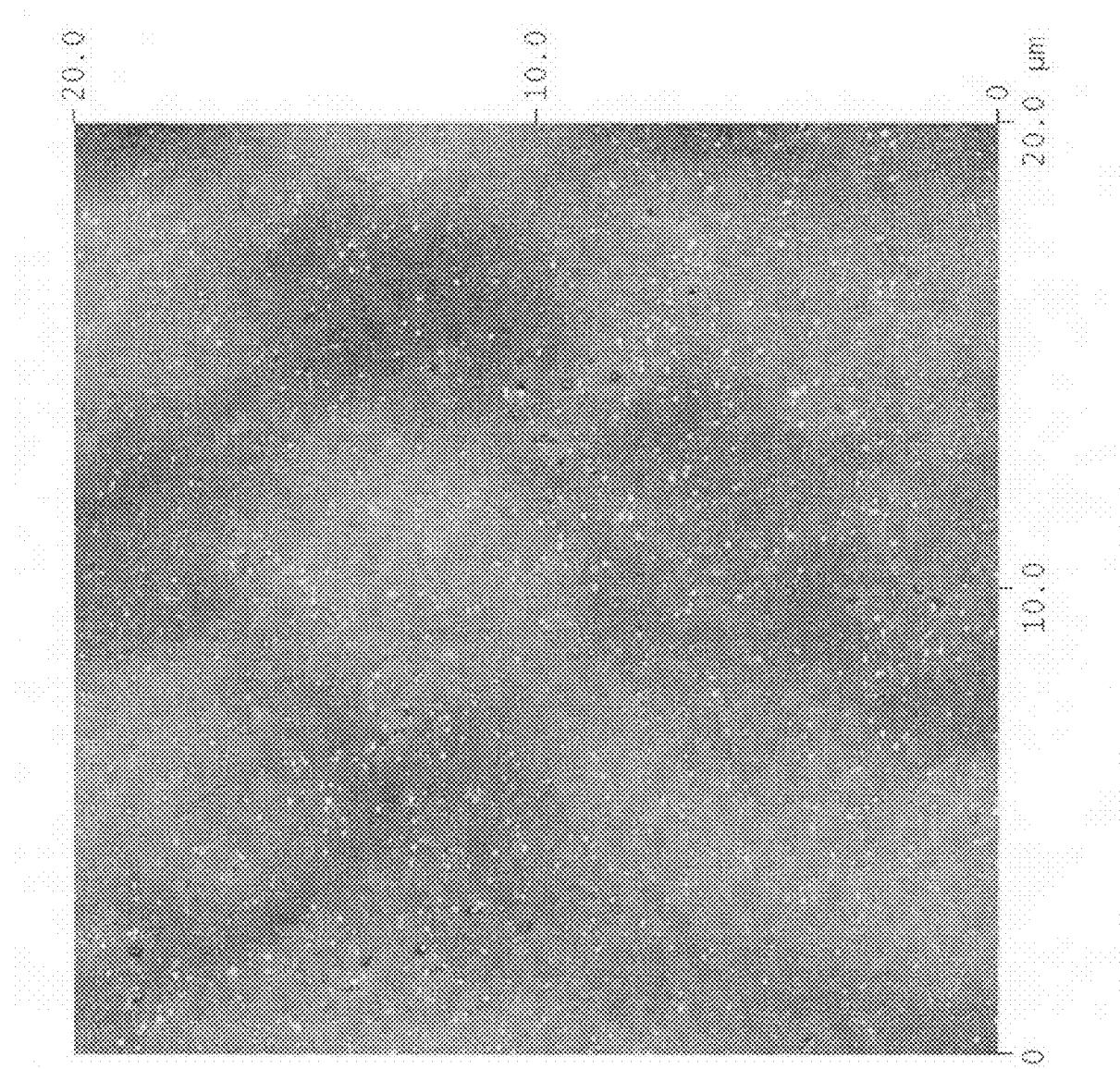
FIG. 10 is atomic force microscopy image of the same semiconductor layer of FIG. 9, shown after laser annealing.

Similarly, FIGS. 9, 10 and 11 visually depict the improvement to and significant reduction of the surface roughness. FIG. 9 is an atomic force microscopy (AFM) image of the initial cleaved surface 123 of the SiOG structure 100 formed using an embodiment of the aforementioned fabrication process. FIG. 10 is an atomic force microscopy image of the annealed surface 123A of the same SiOG structure 100 in FIG. 9 after ten laser pulses at 1250 mJ/cm². Comparing the image of FIG. 9 with that of FIG. 10, it is clear that the annealing process removed surface irregularities.

Better surface roughness reduction has been achieved with relatively high pulse energy densities (1250 mJ/cm²). However, at these high energy densities, local defects such as cracks may be created in the silicon film by the annealing process, presumably due to the hydrogen out-diffusion. In some cases it may be beneficial to use different energy densities successively in the annealing process, starting with a lower energy density that will allow (some) hydrogen to out-diffuse and continuing with a high energy density.

Figures 11A, 11B:
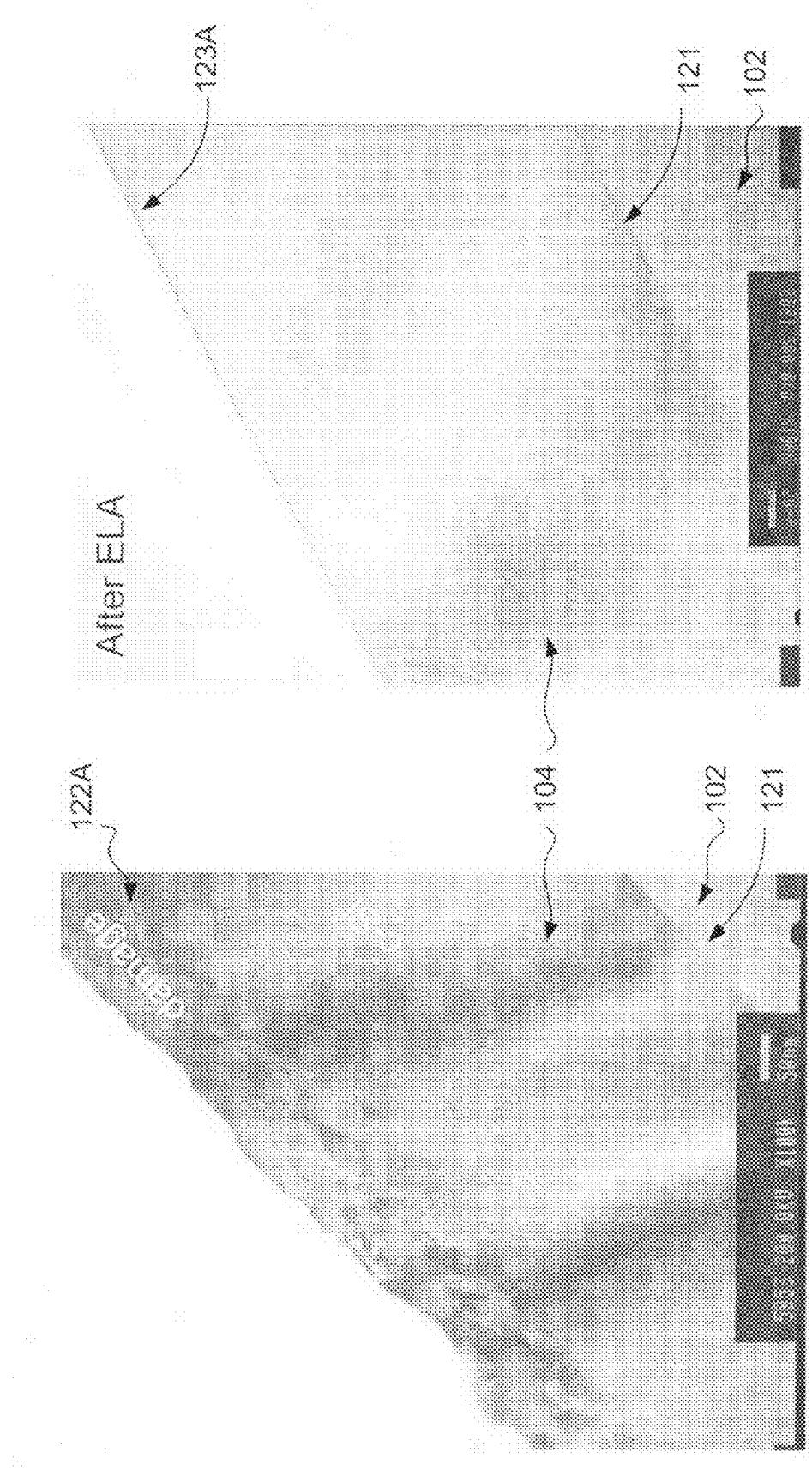
FIGS. 11A and 11B depict transmission electron microscope (TEM) cross-sectional images of an exemplary semiconductor layer before annealing and after annealing, respectively.
Figure 12A:
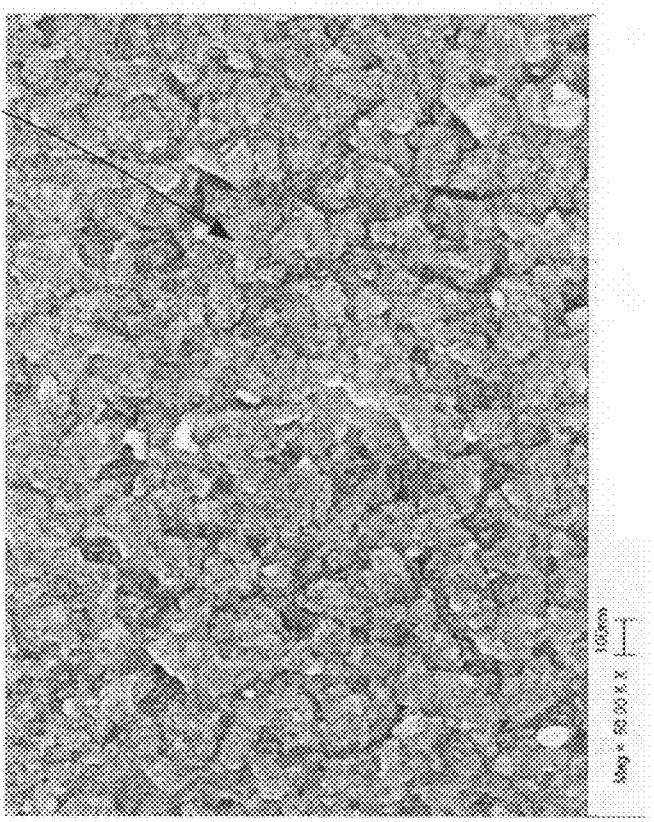
FIGS. 12A and 12B depict scanning electron microscope (SEM) planar images of an exemplary semiconductor layer before annealing and after annealing, respectively.
Figure 12B:
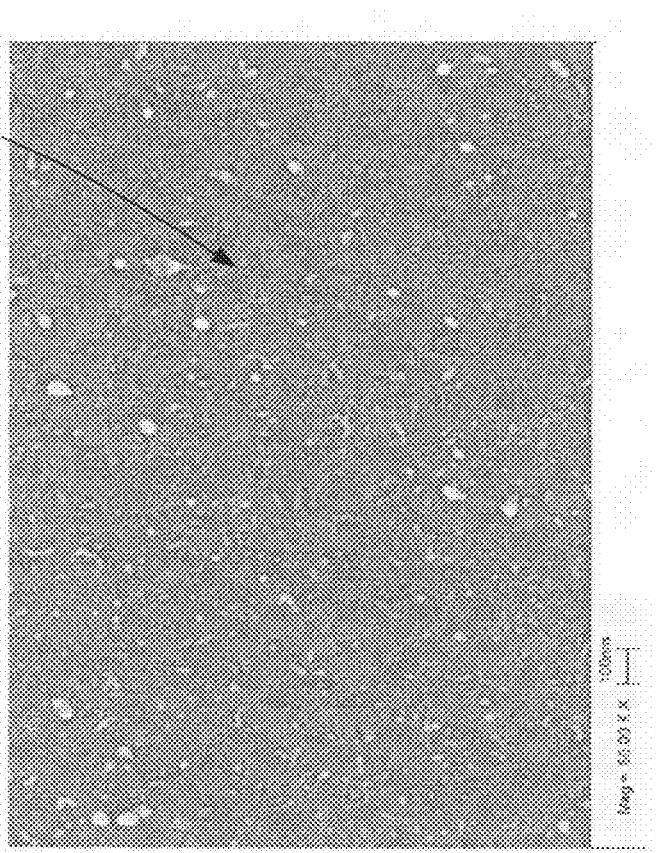

As shown more dramatically in FIGS. 11A, 11B, 12A, and 12B, the annealing process results in a relatively smooth, annealed surface 123A, healed of implantation damage 122A, on the semiconductor layer 104 of the SiOG structure 100. FIGS. 11A and 11B depict transmission electron microscope (TEM) cross-sectional images of a semiconductor layer 104 as-formed, i.e., before annealing, and after annealing, respectively. In case of FIG. 11B, the annealing process consisted of 10 pulses at 800 mJ·cm⁻². FIGS. 12A and 12B depict scanning electron microscope (SEM) planar images of a semiconductor layer 104 as-formed, i.e., before annealing, and after annealing, respectively. In this example, annealing was done with 15 pulses at 800 mJ·cm⁻² followed by 10 pulses at 1200 mJ·cm⁻². In FIGS. 11A and 12A, the surface damage 122A of the initial cleaved surface 123 is evident, whereas the annealed surface 123A is much cleaner in FIGS. 11B and 12B, and shows higher quality crystallinity.

Figure 13:
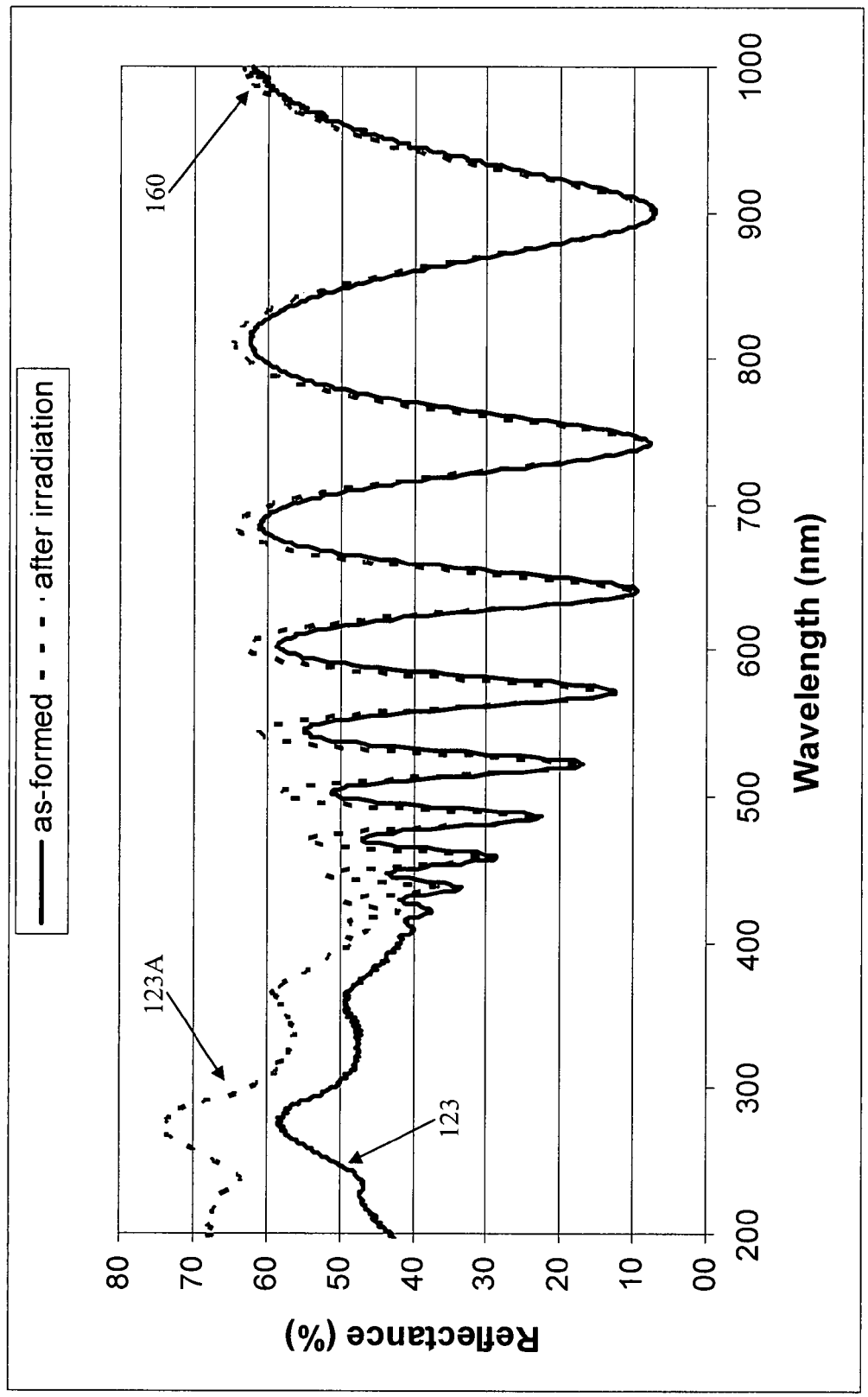
FIG. 13 is a graph of optical reflectance data of a pre-laser-annealed sample versus the optical reflectance data of a post-laser-annealed sample, according to the present invention.

In the same vein, FIG. 13 shows the optical reflection data from the SiOG structure 100, both of the cleaved surface 123, as-formed, and of the annealed surface 123A, after irradiation by ten pulses at 1000 mJ/cm². The interference fringes 160, on the right, are nearly identical for the irradiated and non-irradiated film, indicating the film thickness is not changed by the laser exposure, a finding that is confirmed in surface profile measurements. However the absolute reflectance for the annealed surface 123A exceeds that of the cleaved surface 123 for wavelengths below 400 nm, on the left. This additional reflectance is characteristic of a decrease in the surface roughness, as already concluded from the AFM data, and of a decrease in crystal defects at the film surface. Moreover, the data for the irradiated sample is consistent with corresponding data, not depicted, for a pure single-crystal silicon surface.

Electrical measurements on the samples also may be performed to confirm the near-single-crystal crystallinity of the annealed surface 123A. These measurements further indicate a reduction in the number of undesirable electrically active hydrogen atoms in the film. Thus, the laser annealing process substantially removed the implantation damage 122A, by releasing the captive hydrogen ions and by restoring the semiconductor layer 104 to a near-single-crystal state, in addition to smoothing its surface 123A.

In summary, the present invention is believed to represent the first application of laser annealing to an SOI substrate formed by hydrogen ion implantation. It offers a unique solution for simultaneously improving the surface roughness and crystallinity in the silicon.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

We claim:

1. A method of forming a semiconductor-on-insulator structure, comprising:
    subjecting an implantation surface of a crystalline donor semiconductor wafer to an ion implantation process to create an exfoliation layer of the donor semiconductor wafer;
    bonding the implantation surface of the exfoliation layer to an insulator substrate;
    separating the exfoliation layer from the donor semiconductor wafer, thereby exposing at least one cleaved surface; and
    subjecting the cleaved surface to a radiation annealing process.

2. The method of claim 1, wherein the radiation annealing process includes subjecting the cleaved surface to microwave radiation.

3. The method of claim 1, wherein the radiation annealing process comprises a laser annealing process.

4. The method of claim 1, wherein the at least one cleaved surface includes a first cleaved surface of the donor semiconductor wafer and a second cleaved surface of the exfoliation layer.

5. The method of claim 4, wherein the radiation annealing process is applied to at least the second cleaved surface of the exfoliation layer.

6. The method of claim 4, wherein the radiation annealing process is applied to at least the first cleaved surface of the donor semiconductor wafer.

7. The method of claim 1, wherein the radiation annealing process includes subjecting the at least one cleaved surface to laser radiation.

8. The method of claim 7, wherein the at least one cleaved surface comprises crystalline silicon.

9. The method of claim 7, wherein the subjecting the at least one cleaved surface to laser radiation comprises:
    subjecting the at least one cleaved surface to a first laser radiation; and
    subjecting the at least one cleaved surface to a second laser radiation that has a higher intensity than the first laser radiation.

10. The method of claim 1, wherein prior to the step of subjecting an at least one cleaved surface of a crystalline layer to a radiation annealing process, the whole crystalline layer is heated to an elevated temperature from 100° C. to $T_{sp}-100$° C., where $T_{sp}$ is the strain point of a glass contained in the semiconductor-on-insulator structure, or the melting point of the component in the semiconductor-on-insulator structure with the lowest melting temperature.

11. The method of claim 1, wherein prior to subjecting the at least one cleaved surface of a crystalline layer to the radiation annealing process, the at least one cleaved surface is cleaned and/or a surface layer of oxide is removed.

12. The method of claim 3, wherein the laser radiation has an energy level sufficient to temporarily melt at least part of the at least one unfinished surface.

13. The method of claim 1, wherein the bonding comprises:
    heating at least one of the insulator substrate or the donor semiconductor wafer;
    contacting the donor semiconductor wafer directly or indirectly with the exfoliation layer of the donor semiconductor wafer; and
    applying a voltage potential across the insulator substrate and the donor semiconductor wafer to induce the bonding.

14. The method of claim 1, wherein the donor semiconductor wafer is selected from: silicon, germanium-silicon, silicon carbide, germanium, gallium arsenide, gallium phosphide, and indium phosphide.

15. The method of claim 1, wherein the donor semiconductor wafer includes a substantially single-crystal donor semiconductor wafer, wherein the separated layer is formed substantially from the single-crystal donor semiconductor wafer material.

16. The method of claim 1, wherein the donor semiconductor wafer includes a donor semiconductor wafer and an epitaxial semiconductor layer disposed on the donor semiconductor wafer, and the separated layer is formed substantially from the epitaxial semiconductor layer.

* * * * *